United States Patent [19]
Kingsley et al.

[11] Patent Number: 5,179,284
[45] Date of Patent: Jan. 12, 1993

[54] SOLID STATE RADIATION IMAGER HAVING A REFLECTIVE AND PROTECTIVE COATING

[75] Inventors: Jack D. Kingsley, Schenectady; Stanley J. Lubowski, Scotia, both of N.Y.

[73] Assignee: General Electric Company, Schenectady, N.Y.

[21] Appl. No.: 747,827

[22] Filed: Aug. 21, 1991

[51] Int. Cl.$^5$ .............................................. G01T 1/202
[52] U.S. Cl. .............................. 250/370.11; 250/367; 250/368
[58] Field of Search .................. 250/227.31, 368, 367, 250/370.11

[56] References Cited

U.S. PATENT DOCUMENTS

| | | | |
|---|---|---|---|
| 4,029,964 | 6/1977 | Ashe | 250/368 |
| 4,158,773 | 6/1979 | Novak | 250/361 R |
| 4,720,426 | 1/1988 | Englert et al. | 428/344 |

FOREIGN PATENT DOCUMENTS 2471610 6/1981 France ............................ 250/368

*Primary Examiner*—Constantine Hannaher
*Attorney, Agent, or Firm*—Donald S. Ingraham; Marvin Snyder

[57] ABSTRACT

A radiation imager having a scintillator mated to a photodetector array has a moisture barrier disposed over at least the portion of the scintillator exposed to the incident radiation. The moisture barrier, which is substantially impervious to moisture, is both radiation transmissive and optically reflective. A pellicle layer may be disposed between the top surface of the scintillator array and the moisture barrier to provide a stable surface to which the moisture barrier can adhere. The moisture barrier normally comprises an optically reflective layer and a moisture sealant layer. The optically reflective layer is comprised of a reflective metal or dielectric layers have different refractive indices and the moisture sealant layer is comprised of a silicone potting compound. A hardened protective window may be situated over the top surface of the moisture barrier.

18 Claims, 1 Drawing Sheet

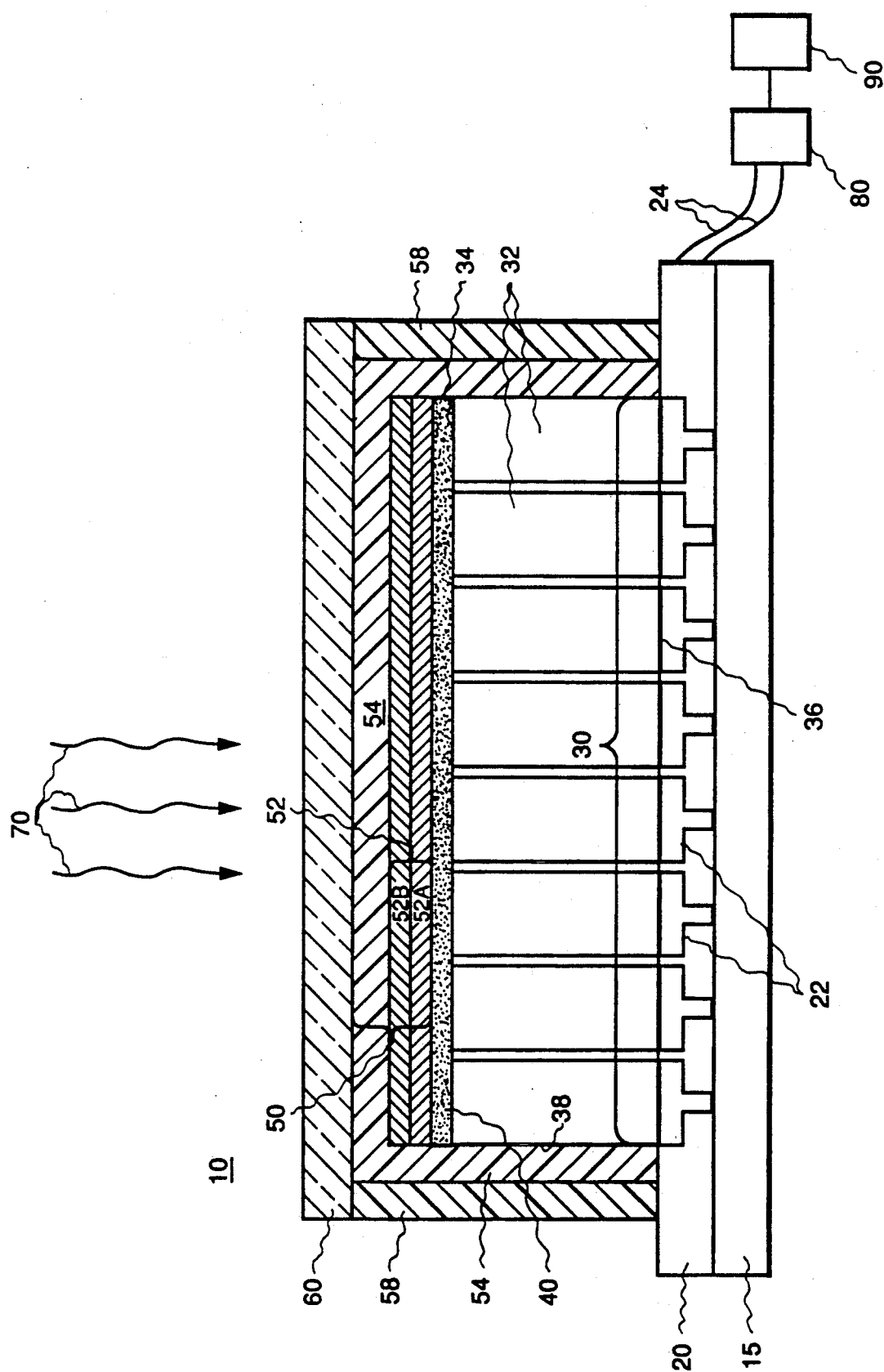

SOLID STATE RADIATION IMAGER HAVING A REFLECTIVE AND PROTECTIVE COATING

RELATED APPLICATIONS AND PATENTS

This application is related to application Ser. No. 07/751,849 filed Aug. 29, 1992, now U.S. Pat. No. 5,132,539, and entitled "Planar X-Ray Imager Having A Moisture-Resistant Sealing Structure", by Robert F. Kwasnick et al. which is assigned to General Electric Company and incorporated herein by reference.

FIELD OF THE INVENTION

This invention relates generally to radiation imaging systems and more particularly to scintillators coupled to photodectors for use in such systems.

BACKGROUND OF THE INVENTION

Radiation imaging systems are widely used for medical and industrial purposes. Imaging systems have been developed which use detected radiation to produce a signal which can be used to operate a visual display device or which can be used for other analyses of the pattern of detected electromagnetic radiation such as x-ray or gamma ray radiation. In such systems the radiation is typically absorbed in a scintillator material, resulting in the generation of photons of light. Light photons emanating from the scintillator are detected by the photodetectors to generate an electrical output signal that can be processed to drive the display or analysis system.

The scintillator material may be in the form of a solid block or may be divided into separate elements, such as by dicing or cutting, or by depositing the scintillator material in such a manner that individual columns or peaks are formed. It is important to protect the scintillator material from moisture absorption. For example, cesium iodide, a common scintillator material, is a hygroscopic material, that is, it exhibits a tendency to absorb moisture from the atmosphere around it; in so doing it becomes hydrolized with a consequent degradation in its luminescent properties. In a radiation detector it it is also beneficial to maximize the efficiency with which the luminescence from the scintillator is collected by the photodiodes by ensuring that the majority of photons generated in the absorption event are directed to the photodetectors.

Covering the scintillator with a thin coating is difficult due to the irregularly shaped ends or surfaces of the scintillator material, such as typically result from the common evaporative deposition processes used in formation of scintillators. Such irregular surfaces require that any coating be at least initially pliable so as to conform to the surface of the scintillator, and require that a stable and adherent surface be prepared to allow the deposition of an uniform layer of optical reflective material, such as a metal. Typical prior art imagers, such as the device of Derenzo disclosed in U.S. Pat. No. 4,672,207, do not suggest any protective or reflective coating for the surfaces of the scintillator.

It is accordingly an object of this invention to provide a protective coating for the scintillator elements of an imager, which coating will serve as a barrier to inhibit absorption of moisture by the scintillator from the atmosphere surrounding the scintillator.

It is another object of this invention to provide a protective coating that is optically reflective and substantially transparent to electromagnetic radiation of a predetermined wavelength.

It is another object of this invention to provide a radiation imaging device of improved efficiency through the use of a protective layer that is substantially impervious to moisture, is optically reflective, and that closely adheres to the uneven surfaces of a scintillator.

SUMMARY OF THE INVENTION

In accordance with the present invention, a radiation imaging device comprises a scintillator, an array of photodetectors which is optically coupled to the scintillator, and a moisture barrier disposed over the surface of the scintillator through which the incident radiation enters the device. The moisture barrier is substantially impervious to moisture, radiation transmissive, and optically reflective.

In a typical arrangement, the moisture barrier is comprised of at least two layers, a moisture sealant layer and an optically reflective layer. The moisture sealant layer comprises a silicone potting compound, and the optically reflective layer comprises relatively thin layers of a metal or combination of metals such as silver, gold, or aluminum. A pellicle layer is disposed between the moisture barrier and the scintillator to provide a thin coating that acts as a stable surface to which the moisture barrier can adhere. The scintillator can be encapsulated by the moisture sealant layer extending around all surfaces of the array which are not coupled to the photodetector array. The moisture barrier can be augmented and protected from abrasion or puncture by the placement of a hardened, radiation transmissive window across the portion of the moisture barrier that covers the surface of the scintillator exposed to the incident radiation.

The invention thus provides a sealed environment which protects the scintillator from moisture absorption and that reflects light photons back into the scintillator elements in the direction of the photodetector array.

BRIEF DESCRIPTION OF THE DRAWING

The features of the invention believed to be novel are set forth with particularity in the appended claims. The invention itself, however, both as to organization and method of operation, together with further objects and advantages thereof, may best be understood by reference to the following description in conjunction with the accompanying drawing in which:

The single Figure is a schematic cross sectional diagram of a radiation imaging device in accordance with this invention.

DETAILED DESCRIPTION OF THE PREFERRED EMBODIMENT

In the single Figure, a radiation imaging device 10 comprises a photodetector array 20 disposed on a substrate 15, a scintillator 30 disposed over the photodetector array, and a moisture barrier 50 having an optically reflective layer 52 and a moisture sealant layer 54 disposed over the scintillator. The photodetector array is coupled to a processing circuit 80, which processes the electrical signals for use in display and analysis equipment 90.

Photodetector array 20 is comprised of a plurality of photodetectors 22 arranged and electrically connected in a pattern, typically rows and columns. The photodetectors are disposed on substrate 15 to form an array that can be of any size and shape appropriate for the use of imaging device 10, such as for medical analyses of particular portions of the body. The photodetectors are advantageously amorphous silicon photodiodes, and alternatively may comprise other known solid state photodetector devices. Cables 24 carry the electrical signals generated in the photodetectors to processing circuit 80.

Scintillator 30 is positioned adjacent to, and optically coupled to, photodetector array 20. As used herein, "optically coupled to photodetector array 20" refers to arranging the two arrays so that light photons from the scintillator readily pass into photodetectors; the optical coupling may include a separate layer (not shown) of a material which aids in the efficient transfer of the photons from the scintillator to the photodetectors. Scintillator 30 advantageously may be divided into a plurality of separate scintillator elements 32, as shown, or may alternatively comprise a single, substantially homogeneous block of scintillator material (not shown). Scintillator elements 32 may be diced, or cut, from a larger block of scintillator material or may be separately grown or deposited in columnar structures using a known method such as vapor deposition or sputtering. After the deposition process, the surface of the scintillator may be irregular or have protrusions. Scintillator 30 may be grown, or deposited, directly onto photodetector array 20 or may be separately formed and then aligned with, and mated to, photodetector array 20. Scintillator elements 32 are arranged in an array that substantially corresponds to the arrangement of photodetector array 20. The scintillator has a first end or surface 34 through which incident x- or gamma radiation 70 enters, and a second end or surface 36, which is opposite to the first end or surface, through which the light photons pass to the adjoining photodetector array 20. The material that is used to form scintillator 30 is typically cesium iodide, but can alternatively comprise other known scintillating materials.

In accordance with the present invention a moisture barrier 50 is disposed over at least the the top of scintillator array 30, extending over first surface 34 of scintillator 30 to seal the scintillator from moisture that may be present in the atmosphere around imaging device 10. Particularly when first surface 34 of the scintillator is rough or has an uneven shape, such as when scintillator elements 32 have been deposited in columnar structures, pellicle layer 40 is advantageously disposed over first surface 34 of the scintillator. Pellicle layer 40 adheres well to the uneven surface of the scintillator and provides a stable, i.e. firm and reasonably smooth, surface to which moisture barrier 50 can adhere. The pellicle layer is typically very thin, having a thickness between about 200 to 600 Angstroms, and comprises organic materials such as nitrocellulose, poly(para-xylene), or organopolysiloxanepolycarbonate, or alternatively comprises inorganic material such as kryolite. Pellicle layer 40 can be made in any conventional manner, such as by preparation of the thin layer on a water bath and then setting the layer into place.

Moisture barrier 50 is substantially impervious to moisture, is optically reflective, and is radiation transmissive. As used in the context of this invention, "impervious to moisture" means that the barrier forms a seal which prevents moisture in liquid or vapor form from passing across the barrier; "optically reflective" refers to the property of moisture barrier 50 that causes light photons emanating from the scintillator to be reflected back into the scintillator, thus minimizing the amount of light which escapes the scintillator and is not detected by a photodetector; and "radiation transmissive" refers to radiation of the type to be detected by the device and signifies that the barrier typically does not strongly interact with the material forming the barrier, thus allowing the maximum amount of the incident radiation to enter the scintillator without absorption or scattering.

As illustrated in the Figure, moisture barrier 50 comprises an optically reflective layer 52 and a moisture sealant layer 54. Optically reflective layer 52 is advantageously made of a highly reflective metal such as silver, gold, aluminum or the like, or may be formed as a multilayer dielectric mirror. The thickness of a metallic reflector would advantageously be in the range of about 100 to about 2000 angstroms. Because of the chemical reactivity of silver, layer 52 advantageously is composed of two or more sublayers 52A, 52B, wherein sublayer 52A preferably is silver and sublayer 52B advantageously is either of gold or a similarly less reactive metal. If reflective layer 52 is a multi-layer dielectric mirror, the adjoining sublayers would have materials which have significantly different refractive indices; for example, the sublayers may advantageously be formed of silicon dioxide, which has a refractive index of about 1.45, and titanium oxide, which has a refractive index of about 2.6. Alternatively, tantalum oxide can be substituted for titania; other materials having suitable refractive indices and capable of being deposited in thin films from the vapor phase can alternatively be used. The design of dielectric mirrors is well known to those skilled in the art, with the thicknesses and number of layers dependent on the range of wavelengths to be reflected. Such mirrors may have about 10 to about 20 layers.

Moisture sealant layer 54 is disposed over scintillator 30, and at least extends over optically reflective layer 52. Moisture sealant layer 54 advantageously extends around the outer edges or sidewalls 38 of scintillator 30 along the length of the scintillator from first surface 34 to second surface 36. Enclosure walls 58 disposed on photodetector array 20 run substantially parallel to outer edges 38 of the scintillator. The enclosure walls serve to retain moisture sealant layer 54, which can, at least when initially applied, be in a liquid form and cure to a harder state after application, against scintillator sidewalls 38. By way of example and not limitation, enclosure walls 58 may comprise a bead or dam of epoxy laid down around the outer edges of the scintillator. The scintillator can thus be encapsulated to minimize locations where the scintillator material might be exposed to moisture present in the ambient environment or atmosphere around device 10. The interface formed by the optical coupling of scintillator 30 to photodetector array 20 typically results in the scintillator array being sealed from moisture along that interface.

Moisture sealant layer 54 is preferably a silicone potting compound such as GE Silicone Gel RTV 6157, Dow Corning Sylgard ® or a similar material that is substantially impervious to moisture and not reactive to the radiation flux to which it is exposed in this structure. Sealant layer 54 typically has a thickness between about $\frac{1}{4}$ mm and 1 mm.

A radiation transmissive window 60 is disposed over the top surface of moisture barrier 50 to provide a hardened protective surface over moisture sealant layer 54. As illustrated in the FIGURE, window 60 contacts enclosure walls 58 and thus can provide additional structural strength to device 10; alternatively, window 60 may be disposed only over the top surface of moisture sealant layer 54. Window 60 may be positioned on the device after moisture sealant layer 54 has been applied to optically reflective layer 52, or alternatively, moisture sealant layer 54 may be applied to window 60 first, and the window can then be positioned on the device 10 before moisture sealant layer 54 has cured. Radiation transmissive materials that are advantageously used in the fabrication of window 60 include quartz glass, aluminum, aluminum oxide ceramic, beryllium and the like.

In operation, device 10 is postioned to be in the path of incident radiation 70 that is of interest. The radiation, which may be x-rays, gamma rays, or other radiation detectable via the use of scintillators and photodetectors, passes through window 60, moisture barrier 50, pellicle layer 40 and into scintillator 30, where it interacts with the scintillator material and is absorbed. In the interaction, light photons are given off, more or less in random directions. Light photons that emanate toward the first surface 34 of the scintillator 30, or that are reflected in that direction after striking the walls of the scintillator, pass through the pellicle layer but are reflected back into the scintillator by optically reflective layer 52. Light photons are thus directed to second surface 36 of the scintillator, where they exit the scintillator and enter the photodetector mounted adjacent to the scintillator. The photodetectors generate an electrical signal which corresponds to the energy level of the incident radiation and which is processed by processing circuit 80. Circuit 80 is coupled to imaging and analysis equipment 90, which is responsive to the electrical signals generated in processing circuit 80.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A radiation imaging device, comprising:
    a scintillator having a first and a second surface, said first and second surfaces being opposite one another, the radiation incident on said device entering said scintillator through said first surface, said first surface having uneven protrusions extending therefrom;
    an array of photodetectors, said photodetectors being optically coupled to said surface of said scintillator to receive light therefrom;
    a moisture barrier comprising at least an optically reflective layer and a moisture sealant layer disposed over said optically reflective layer, said moisture barrier being substantially impervious to moisture and being optically reflective and radiation transmissive, said moisture barrier further being disposed at least over said first surface of said scintillator and forming a moisture resistant seal thereover:
    a pellicle layer disposed between said moisture barrier and the irregular first surface of said scintillator, said pellicle layer being disposed to form a stable surface to which said moisture barrier adheres, said pellicle layer extending between said uneven protrusions from said first surface of said scintillator: and
    a radiation transmissive window disposed over at least the portion of said moisture barrier overlying said first surface of said scintillator, said window providing a hardened protective surface over said moisture barrier.

2. The device of claim 1 wherein said radiation transmissive window comprises a material selected from the group consisting of quartz glass, aluminum, aluminum oxide ceramic, and beryllium.

3. The device of claim 1 wherein said moisture sealant layer extends around the outer edges of said scintillator.

4. The device of claim 3 wherein said moisture sealant layer comprises a silicone potting compound.

5. The device of claim 1 wherein said pellicle layer comprises material selected from the group consisting of nitrocellulose, poly(para-xylene), organpolysiloxane-polycarbonate, and kryolite.

6. The device of claim 1 wherein said optically reflective layer further comprises a plurality of sublayers.

7. The device of claim 6 wherein said sublayers comprise dielectric material, each sublayer of dielectric material having an optical index different than the optical index of adjoining sublayers.

8. The device of claim 6 wherein the thickness of said optically reflective layer is between about 100 and 2000 Angstroms.

9. The device of claim 1 wherein said optically reflective layer comprises material selected from the group consisting of silver, gold, and aluminum.

10. The device of claim 1 wherein each of said photodetectors comprises an amorphous silicon photodiode.

11. The device of claim 1 where said scintillator comprises cesium iodide.

12. A radiation imaging device comprising:
    an array of scintillator elements, said scintillator elements each having a first and a second end, said first and second ends being opposite one another, the surface of each of said first ends having uneven protrusions extending therefrom, the radiation incident on said device entering said elements through said first end;
    an array of solid state photodetectors, said photodetectors being optically coupled to said second ends of said scintillator elements to receive light therefrom;
    a moisture barrier comprising at least an optically reflective layer and a moisture sealant layer disposed over said optically reflective layer, said moisture barrier being substantially impervious to moisture and being optically reflective and radiation transmissive, said moisture barrier further being disposed at least over said first ends of said scintillator elements, forming a moisture resistant seal thereover;
    a pellicle layer disposed between said moisture barrier and the irregular surfaces of said first ends of each of said scintillator elements, said pellicle layer being disposed to form a stable surface to which said moisture barrier adheres, said pellicle layer extending between said uneven protrusions from said first surfaces of respective ones of said scintillator elements; and.
    a radiation transmissive window disposed over at least the portion of said moisture barrier overlying said first ends of said array of scintillator elements, said window providing a hardened protective surface over said moisture barrier a processing circuit coupled to receive signals generated by said photodetector array; and display and analysis equipment coupled to, and responsive to, said processing circuit.

13. The device of claim 12 wherein said optically reflective layer comprises material selected from the group consisting of silver, gold, and aluminum.

14. The device of claim 13 wherein said optically reflective layer comprises layers of dielectric material, each of said layers having an optical index different than the optical index of adjoining layers.

15. The device of claim 12 wherein said moisture sealant layer comprises a silicone potting compound.

16. The device of claim 12 wherein said pellicle layer comprises material selected from the group consisting of nitrocellulose, poly(para-xylene), organpolysiloxane-polycarbonate, and kryolite.

17. The device of claim 12 wherein said solid state photodetectors comprise amorphous silicon photodiodes.

18. The device of claim 12 wherein said scintillator elements comprise cesium iodide.

* * * * *